United States Patent [19]
Dydyk et al.

[11] Patent Number: 4,514,707
[45] Date of Patent: Apr. 30, 1985

[54] DIELECTRIC RESONATOR CONTROLLED PLANAR IMPATT DIODE OSCILLATOR

[75] Inventors: Michael Dydyk, Scottsdale; Herbert W. Iwer, Tempe, both of Ariz.

[73] Assignee: Motorola, Inc., Schaumburg, Ill.

[21] Appl. No.: 388,762

[22] Filed: Jun. 15, 1982

[51] Int. Cl.³ .............................................. H03B 7/00
[52] U.S. Cl. ........................... 331/107 SL; 331/117 D
[58] Field of Search ........ 331/107 SL, 107 G, 107 R, 331/107 DP, 96, 117 D

[56] References Cited

U.S. PATENT DOCUMENTS

| 4,054,875 | 10/1977 | Cachier | 331/107 R X |
| 4,311,970 | 1/1982 | Bert et al. | 331/107 R |
| 4,331,940 | 5/1982 | Uwano | 331/117 D |

FOREIGN PATENT DOCUMENTS

| 55-78607 | 6/1980 | Japan | 331/107 SL |
| 56-47107 | 4/1981 | Japan | 331/107 R |
| 56-168405 | 12/1981 | Japan | 331/96 |

OTHER PUBLICATIONS

Sullivan, W. H. et al., "Second Harmonic Tuning Effects on IMPATT Diode Oscillator Noise Characteristics", 1971, G-MTT Symposium Digest, pp. 92-93, (May 18, 1971).

Plourde, J. K. et al., "Application of Dielectric Resonators in Microwave Components", IEEE Transactions on Microwave Theory & Techniques, v. MTT-29, No. 8, pp. 754-770, (Aug. 81).

Satoh, G., "Stabilized Microstrip Resonator Using a Temperature-Stable Dielectric Resonator", 1974, IEEE International Solid-State Circuits Conference, pp. 184-185, (Feb. 15, 1974).

Cohen, J. et al., "Temperature Stability of an MIC Gunn-Effect Oscillator", IEEE Transactions on Microwave Theory & Techniques, v. MTT-27, No. 7, pp. 115-116, (Jul. 79).

Makino, T. et al., "A Highly Stabilized MIC Gunn Oscillator Using a Dielectric Resonator", IEEE Transactions on Microwave Theory & Techniques, v. MTT-27, No. 7, pp. 633-638, (Jul. 79).

Primary Examiner—Eugene R. LaRoche
Assistant Examiner—Robert J. Pascal
Attorney, Agent, or Firm—Raymond J. Warren

[57] ABSTRACT

An IMPATT diode oscillator wherein the diode is coupled to a first transmission line in turn coupled to a bias port at one end and to a coupled line transformer formed with a second transmission line at the other. A stabilizing load is coupled to the first transmission line between the diode and the bias port. A first tunable resonator controlling the fundamental frequency of the oscillator and a second tunable resonator controlling the second harmonic frequency of the oscillator are coupled to the first transmission line between the diode and the stabilizing load so that independent control of the fundamental and the second harmonic is attained in a temperature stable device.

17 Claims, 5 Drawing Figures

DIELECTRIC RESONATOR CONTROLLED PLANAR IMPATT DIODE OSCILLATOR

BACKGROUND OF THE INVENTION

The present invention relates to diode oscillators and in particular to planar, dielectric resonator controlled IMPATT diode oscillators.

The advantages in the use of dielectric resonators in microwave integrated circuits result from the combination of properties that they possess. They offer low-cost, high-quality resonators which are small and which approximate lumped resonant elements for use in integrated microwave circuits. They fill a gap between waveguide and stripline technologies by providing Q's and temperature stabilities approaching those of Invar (TM) cavity resonators. They offer versatility and are adaptable to various microwave structures and coupling configurations.

Using these dielectric resonators in conjunction with such active devices as bipolar transistors, FET's and Gunn diodes, planar oscillators have been developed that have high frequency stability and low noise performance.

However, to date the open literature has reported few planar, dielectric resonator controlled oscillator circuits for an IMPATT diode and these few have been successful only to a limited degree. Due to the difficulty of satisfying all of the necessary constraints in realizing a successful IMPATT diode planar oscillator circuit, existing circuits have to compromise stability, have to tolerate noise and yet are not readily reproducible.

In general, it is difficult to sustain oscillation with Si IMPATT diodes due to moding which occurs as a result of the large frequency bandwidth over which negative resistance can be obtained. The problem of moding becomes even worse when GaAs IMPATT diodes are used. Consequently, a controlled impedance seen by the active device is required over the entire negative resistance frequency range.

Applications of IMPATT diodes in planar circuits are further limited because of the extremely low magnitudes (1 to 2 ohms) of the negative resistance. Impedance transformation ratios (output/IMPATT diode) of up to 50:1 are required.

In order to retain the efficiency of the IMPATT diode it is desirable to independently control the second harmonic as well as the fundamental loading.

Finally, to realize a temperature stable planar oscillator using IMPATT diodes, or any other active devices, it is necessary to incorporate a dielectric resonator as the frequency controlling element. This has to be done while retaining control of all the other characteristics discussed above.

SUMMARY OF THE INVENTION

Accordingly it is an object of the present invention to provide a new and improved dielectric resonator controlled planar diode oscillator incorporating an IMPATT diode.

it is a further object of the present invention to provide a planar IMPATT diode oscillator having readily reproducible characteristics suitable for commercial production.

Among the advantages of the present invention are the attainment of DC to RF isolation without need for bias filters, the attainment of frequency tuning in a planar oscillator, and the attainment of a high external quality factor (Qext) for a planar oscillator circuit.

Other advantages include simplicity of construction, temperature stability and the capability of being mechanically tuned.

Additional advantages are provision for independent control of fundamental and second harmonic circuits and provision for out of band stabilizing.

These and other objects and advantages of the present invention will become apparent to those skilled in the art upon consideration of the accompanying specification claims and drawings.

In order to attain the above mentioned objects and advantages the present invention comprises a bias port coupled to a transmission line which is in turn coupled to an IMPATT diode and to means for providing an output. A stabilizing load is coupled between the IMPATT diode and the bias port and a plurality of means for providing resonance is coupled to the transmission line between the stabilizing load and the IMPATT diode.

DESCRIPTION OF THE PREFERRED EMBODIMENT

Figure 1:
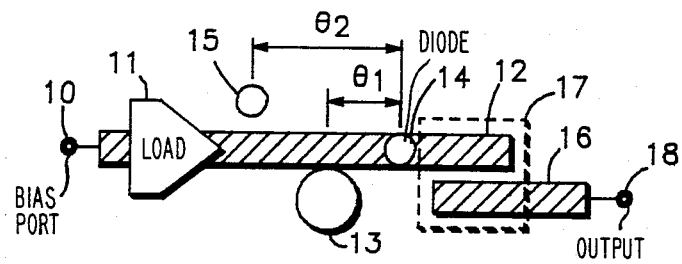
FIG. 1 is a schematic diagram of a first device embodying the present invention.

A preferred embodiment of one planar oscillator circuit incorporating an IMPATT diode is shown in FIG. 1. The circuit comprises a bias port 10 coupled to a first transmission line 12 which is in turn coupled to an IMPATT diode 14. Line 12 is further coupled to a second transmission line 16 to form a coupled line transformer 17 while line 16 is in turn coupled to an output 18.

A stabilizing load 11 is coupled to line 12 between bias port 10 and IMPATT diode 14. A first dielectric resonator 13 and a second dielectric resonator 15 are coupled to line 12 between stabilizing load 11 and IMPATT diode 14.

IMPATT diodes, dielectric resonators, transmission lines, and coupled line transformers are well known and readily available to those skilled in the art and they will not be discussed further. Stabilizing load 11 may comprise a distributed termination.

One skilled in the art understands that although the preferred embodiment of the present invention is described in terms of a planar medium, other media, such as a waveguide medium, could be used to construct an oscillator according to the teachings of the present invention. Furthermore, although the preferred embodiment is shown as having two resonant elements, 13 and 15, one skilled in the art understands that where more control over harmonic frequencies or more isolation is desired, more resonant elements may be employed within the scope of the present invention. In addition, although the preferred embodiment is described in terms of a GaAs diode, one skilled in the art understands that a Si diode may also be employed where the characteristics of a GaAs diode are not required.

Resonator 13 is tuned to the fundamental frequency of the oscillator while resonator 15 is tuned to the second harmonic frequency of the oscillator. The coupled line transformer 17 sets the real part of the impedance seen by the active device 14, and the fundamental dielectric resonator 13 provides the controlling imaginary impedance and thus sets the frequency of the oscillator. The second harmonic dielectric resonator 15 controls the second harmonic loading without effecting the fundamental frequency circuit and thereby provides a desirable independent control between fundamental and second harmonic frequencies. In addition, coupled line transformer 17 decouples the second harmonic from any output load.

Because the active device in question, IMPATT diode 14, has a negative resistance over a broad band of frequencies, it is important to ensure that spurious oscillations cannot occur as a result of reflections at either the DC bias filter or at output mismatches. To overcome some of these difficulties it is expedient to deliberately introduce lossy material into the circuit, such that oscillations are damped in all regions of the frequency spectrum except in that of the desired frequency. This is accomplished in the present invention by introducing fundamental dielectric resonator 13 in conjunction with the stabilizing load 11. In addition, the present invention provides DC to RF isolation without bias filters through the use of the stabilizing load 11 and the fundamental dielectric resonator 13. Therefore the combination of fundamental dielectric resonator 13 and second harmonic dielectric resonator 15, stabilizing load 11 and coupled line transformer 17 assures that controlled impedance is seen by the active device over the desired frequency range. This in turn allows a temperature stable and spurious-oscillation-free IMPATT diode planar oscillator.

The placement of dielectric resonators 13 and 15 with respect to active device 14 as well as their degree of coupling to the circuit is important to the design of the planar oscillator circuit according to the present invention. A separation $\theta_1$ between active device 14 and the fundamental dielectric resonator 13, as shown in FIG. 1, controls $Q_{ext}$, efficiency and degree of stability of the oscillator. There are two cases of interest, i.e., the separation of 90° and 180° respectively. The former, provides temperature stability while the latter, power output efficiency. The analytical basis for both is considered in detail below.

A separation, $\theta_2$, of second harmonic dielectric resonator 15 from active device 14, as shown in FIG. 1, controls output power as well as phase noise of the oscillator. Controlled experiments by other investigators have revealed the principle that the fundamental frequency output power level varies as a function of the second harmonic loading. The observed output power variations extended from the rated output power level of the diode down to zero.

Figure 2:
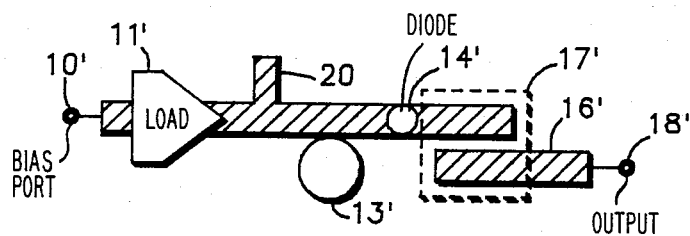
FIG. 2 is a schematic diagram of a second device embodying the present invention.

To reduce cost and still retain the second harmonic control it is possible to replace the second harmonic dielectric resonator 15 with an open circuited stub 20 as shown in FIG. 2. In FIG. 2, elements which are similar to those in the preferred embodiment of FIG. 1 are identified by the same number with the addition of a prime to indicate a different embodiment. In the alternative embodiment of FIG. 2, a trapped resonance for the second harmonic is provided via the length of the stub and the separation between the stub and the active device. Typically, the stub length is a quarter wavelength and the separation is a multiple of a half wavelength, $n\lambda/2$, including n equal to zero. The interaction between the fundamental and second harmonic frequencies is somewhat more pronounced in this approach, due to the T-junction effects of the stub and the substantially lower quality factor ($Q_o$) of the stub as compared to the dielectric resonator.

In most successful oscillator designs a tuning mechanism is provided to take into account the fabrication variances of the circuit as well as the active device. In general, no such mechanism is available in planar circuits. However, by introducing a metal/dielectric tuner above or below the dielectric resonator it is possible to change its resonance frequency and thereby change the frequency of the oscillator.

A tuner introduced from above the dielectric resonator is widely known to those skilled in the art and needs no further elaboration. A tuner may be introduced from below the dielectric resonator by means of a hole in the substrate and the ground plane through which the tuner can travel all the way to the dielectric resonator. The amount of tuner penetration is adjustable based upon need. With the tuner flush with the lower ground plane, the plane opposite the resonator, and the separation between the dielectric resonator and tuner increasing, negligible frequency tuning will be observed. The size of the through hole in the substrate is made smaller than the diameter of the dielectric resonator for the purposes of providing support for the dielectric resonator.

Following the teaching of the present invention, two oscillators were designed, fabricated and evaluated. The first was a pulsed oscillator while the second was a CW oscillator both using GaAs IMPATT diodes and resonators comprising barium tetratitanate. Their performance characteristics are given in Table I.

TABLE I

| Performance Characteristics of Pulsed and CW GaAs IMPATT Diode Oscillators | | | |
|---|---|---|---|
| ITEM | CHARACTERISTICS | PULSED OSC. | CW OSC. |
| 1 | Frequency | C-Band | C-Band |
| 2 | Output Power | 5.9 watts | 2.0 watts |
| 3 | Efficiency at 25° C. | 12 percent | 12 percent |
| 4 | Temperature Stability | 233 KHz/°C. | 300 KHz/°C. |
| 5 | Temperature Range | 0 to +60° C. | −55 to +85° C. |
| 6 | Noise Level Below Carrier | — | 30 dB |

A considerable improvement in the temperature stability is realizable in both oscillators with the utilization of zirconium tin tetratitanate on a fused quartz pedestal.

The use of zirconium tin tetratitanate, as opposed to barium tetratitanate, allows design of a resonator having a frequency versus impedance slope generally opposite in sign to the slope of frequency versus impedance curve of the oscillator for more easily attainable stabilization. The use of a quartz pedestal between the resonator and the substrate helps to isolate the resonator from the substrate, which often has poor temperature characteristics.

ANALYTICAL BASIS OF THE OSCILLATOR CIRCUIT

Figure 3:
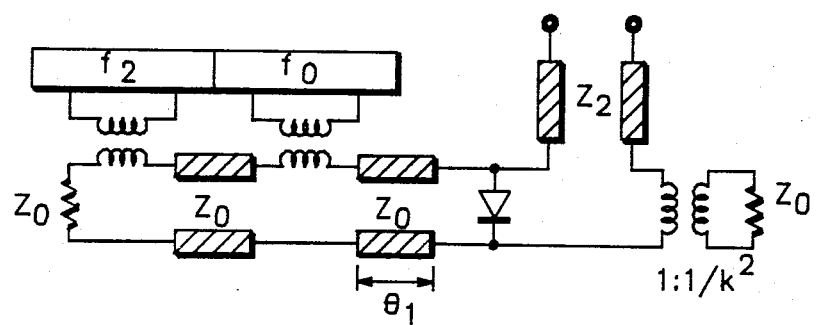
FIG. 3 is a diagrammatic representation of the embodiment of FIG. 1.

To perform any in depth oscillator analysis it is essential to have a complete RF equivalent circuit. For the oscillator according to the present invention, an equivalent circuit is shown in FIG. 3. Using this equivalent circuit it is possible to determine: The frequency controlling element, $Q_{ext}$, the value of the coupled line transformer coupling coefficient and the oscillator efficiency.

The selection of $\theta$, the separation between a resonator and the active device, makes the dielectric resonator susceptance dominant at the plane of the active device and thereby determines that the dielectric resonator controls the frequency of the oscillator. The total input admittance, $Y_{int}$, seen by an active device with $\theta$ equal to 90° is given by $$Y_{int} = \frac{1}{k^2 Z_0 - jZ_2 \cot\phi} + Y_0 + \frac{Y_0 \beta}{1 + jX} \quad (1)$$

where:
- $k$ = coupling coefficient of the coupled line transformer,
- $Z_0 = 1/Y_0$ = the characteristic impedance of the transmission line,
- $\phi$ = the electrical length of the coupled line transformer,
- $\beta$ = the coupling coefficient between the dielectric resonator and the microstrip line, where, $$Z_2 = Z_0(1 - k^2) \quad (2)$$

where, $$X = Q_o \left( \frac{\omega}{\omega_0} - \frac{\omega_0}{\omega} \right) \quad (3)$$

and where:
- $Q_0$ = the quality factor of the dielectric resonator,
- $\omega$ = radial frequency,
- $\omega_0$ = radial frequency at resonance.

The susceptance portion of Eq. (1) is given by $$B_{int} = \frac{Z_2 \cot\phi}{(k_2 Z_0)^2 + (Z_2 \cot\phi)^2} - \frac{Y_0 \beta X}{1 + X^2} \quad (4)$$

where all variables are as defined above.

The first term on the right in Equation (4) is the susceptance due to the coupled line transformer. The second term on the right is the susceptance due to the dielectric resonator. To determine which susceptance will be dominant, it is necessary to find the maximum magnitudes and their location with respect to frequency. This is done by differentiating each term of Equation (4) with respect to frequency and equating the result to zero in order to locate the maximum. For the coupled line transformer and dielectric resonator, respectively, the maximums occur at $$\frac{\Delta f_{CL}}{f_0} = \frac{k^2}{\pi(1 - k^2)} \quad (5)$$

and $$\Delta f_{DR}/f_0 = 1/2Q_0 \quad (6)$$

where:

$\Delta f_{CL}$ = the difference between the resonant frequency and the frequency of the maximum susceptance for the coupled line transformer, $\Delta f_{DR}$ = the difference between the resonant frequency and the location of the frequency of the maximum susceptance for the dielectric resonator, $f_0$ = the resonant frequency, and where all other varible are as defined above.

The respective magnitudes of the susceptances can then be evaluated and are given by:

$$B_{CL}\bigg|_{max} = \frac{Y_0}{2 k^2} \quad (7)$$

$$B_{DR}\bigg|_{max} = \frac{\beta Y_0}{2} \quad (8)$$

where:

$B_{CL}$ = the susceptance of the coupled line transformer, $B_{DR}$ = the susceptance of the dielectric resonator, and where all other variables are as defined above.

Further comparison of the susceptances requires knowledge of typical values of the two coupling coefficients. Assuming that there are no losses, the coupling coefficient of coupled line transformer 17 depends upon the value of the negative resistance of active device 14 in the presence of a large signal, i.e., $$k^2 = |-R_D| Z_0 \quad (9)$$

where:

$-R_D$ = the magnitude of the negative resistance of the active device, and where all other variables are as defined above. For GaAs IMPATT diodes at C-band frequencies $$|-R_D| = 1.7 \Omega \quad (10)$$

and therefore, $$k = 0.184 \quad (11)$$

where k is as defined above.

The coupling coefficient associated with a barium tetratitanate dielectric resonator, and with the resonator placed tangent to the microstrip inner conductor, was determined experimentally to be 20. This particular position, of the dielectric resonator is preferred due to minimum perturbation at other than resonant frequencies. The quality factor, $Q_0$, of the dielectric resonator at C-band frequencies is 3000.

Figure 4:
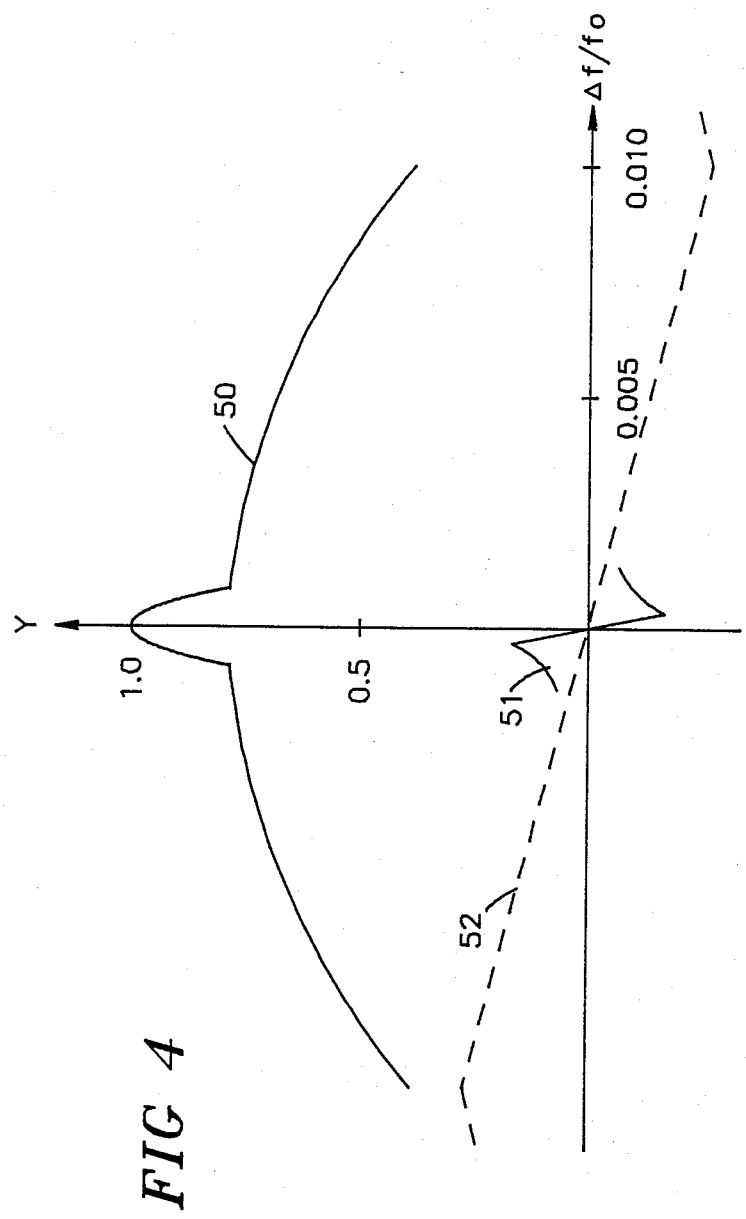
FIG. 4 is a graph of the admittance seen by an active device according to the embodiment of FIG. 1.

With the above information, it is possible to plot the susceptances as well as the total conductance of a device, as shown in FIG. 4. In FIG. 4, the admittance, Y, seen by the active device is plotted against the normalized frequency difference ($\Delta f/f_0$). A curve 50 represents the total conductance of the oscillator, while a curve 51 depicts the susceptance of the dielectric resonator and a curve 52 depicts the susceptance of the coupled line transformer.

From these plots it is obvious to one skilled in the art that for the coupling coefficients selected, the coupled line becomes dominant, but only far removed from the resonance of the dielectric resonator where the total load conductance is less favorable in initiating oscillations. States mathematically, oscillations will occur when $$G_T > |-g_D| \tag{12}$$

with the optimum output load, $G_{ropt}$, being given by $$G_{ropt} = 2|-g_D| \tag{13}$$

where:
$G_T$=the total output load conductance seen by the active device,
$g_D$=the small signal conductance of the active device.

The output load conductance, $G_T$, is the resultant of the dielectric resonator, stabilizing load and coupled line transformer loading. Because $G_T$ is maximum at resonance both for the circuit to the right of the diode and for the circuit to the left of the diode, oscillations will be controlled by the maximum susceptance closest to the resonant frequency of the oscillator which is, in this case, the susceptance of the dielectric resonator. When a source analysis is performed for $\theta$ equal to 180°, it is discovered that the susceptance of the coupled line transformer is dominant. Therefore, for the circuit of FIG. 1, $\theta$ has to be 90° for the dielectric resonator to control the frequency of the oscillator. The approach where $\theta$ equals 180° is used when efficiency is more important than temperature stability. The circuit still provides many useful features, as discussed previously.

The external quality factor of the oscillator circuit, $Q_{ext}$, is determined with the aid of the following basic equation:

$$Q_{ext} = \frac{\omega_0}{2G_L} \left. \frac{\delta B_T}{\delta \omega} \right|_{\omega = \omega_0} \tag{14}$$

where:
$G_L$=the load conductance seen by the active device, and
$B_T$=the total susceptance seen by the active device, and where all other variables are as defined above. For the circuit of FIG. 3 where $\theta = \phi = 90°$, $$G_L = 1/k^2 Z_0, \tag{15}$$

$$\left. \frac{\delta B_T}{\delta \omega} \right|_{\omega = \omega_0} = \frac{2Y_0 Q_0 \beta}{\omega_0} + \frac{\pi Y_0}{2\omega_0} \frac{(1 - k^2)}{k^2} \tag{16}$$

and the $Q_{ext}$ becomes $$Q_{ext} = Q_0 k^2 \beta + \frac{\pi}{4}(1 - k^2) \tag{17}$$

where:
$\theta$=the electrical separation between the dielectric resonator and the active device,
and where all other variables are as defined above.

Figure 5:
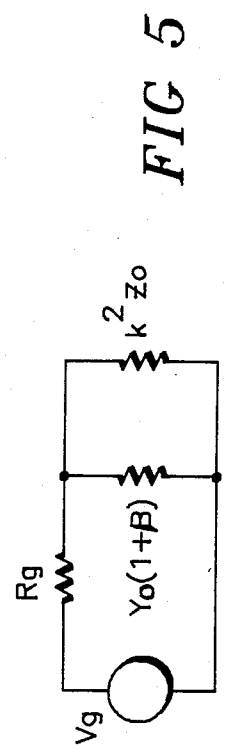
FIG. 5 is a further simplified diagrammatic representation of the circuit of FIG. 3.

The efficiency of this oscillator circuit can be determined from the simplified equivalent circuit shown in FIG. 5, where the active device has been replaced by a voltage generator. Using the ABCD matrix approach, the oscillator efficiency in terms of insertion loss, IL, becomes $$IL = 10 \log_{10}[1 + k_n^2(1 + \beta)] \tag{18}$$

where the new coupled line transformer coupling coefficient, $k_n$, which matches the negative resistance of the active device in the presence of loss, is given by:

$$k_n^2 = \frac{|-R_D| Y_0}{1 - Y_0 |-R_D|(1 + \beta)} \tag{19}$$

and where all other variables are as defined above.

It should be pointed out that the above results are for the case where the active device is self resonant and the circuit operates exactly at resonance of the dielectric resonator and the coupled line transformer. In other words, it is the worst case.

While the present invention has been described in terms of a preferred embodiment, further modifications and improvements will occur to those skilled in the art. We desire it to be understood, therefore, that this invention is not limited to the particular form shown and we intend in the appended claims to cover all such equivalent variations which come within the scope of the invention as described.

We claim:

1. An oscillator comprising:
   a bias port, being fixedly attached to receive a bias input of the oscillator;
   a first transmission line coupled to said bias port;
   an IMPATT diode fixedly attached to said first transmission line;
   a frequency independent stabilizing load coupled to said first transmission line between said IMPATT diode and said bias port;
   a plurality of resonance circuit means electro-magnetically coupled to said first transmission line between said IMPATT diode and said frequency independent stabilizing load; and
   means for providing an output coupled to said IMPATT diode.

2. The oscillator according to claim 1 wherein said means for providing an output comprises:
   an output port being coupled to provide an output of the oscillator; and
   a second transmission line electro-magnetically coupled to said first transmission line between said IMPATT diode and said output port such that said second transmission line forms a coupled line transformer with said first transmission line.

3. The oscillator according to claim 2 wherein said plurality of resonant circuit means coupled to provide resonance comprise a first dielectric resonator.

4. The oscillator according to claim 3 wherein said first dielectric resonator is tuned to the fundamental frequency of the oscillator.

5. The oscillator according to claim 3 wherein said plurality of resonant circuit means coupled to provide resonance further comprise a second dielectric resonator.

6. The oscillator according to claim 5 wherein said second dielectric resonator is tuned to the second harmonic frequency of the oscillator.

7. The oscillator according to claim 3 wherein said plurality of resonant circuit means coupled to provide resonance further comprise an open circuited stub.

8. The oscillator according to claim 7 wherein said open circuited stub is tuned to the second harmonic frequency of the oscillator.

9. The oscillator according to claim 4 or claim 5 wherein the oscillator is embodied in a planar medium.

10. An oscillator comprising:
- a first transmission line having a first end and a second end, said first end comprising a bias port;
- distributed frequency independent stabilizing load means for providing isolation of DC and RF without the need of a bias filter, said distributed frequency independent stabilizing load means being disposed on said transmission line between said first and second ends;
- a second harmonic dielectric resonator electromagnetically coupled to said first transmission line between said distributed frequency independent stabilizing load and said second end;
- a fundamental frequency dielectric resonator electromagnetically coupled to said first transmission line between said second harmonic dielectric resonator and said second end;
- an IMPATT diode fixedly attached to said first transmission line between said fundamental frequency dielectric resonator and said second end;
- coupled line impedance transformer means for transforming a low negative resistance of said IMPATT diode to a high output load impedance independent of said fundamental dielectric resonator, said coupled line impedance transformer lines having an input and an output, said input being coupled to said second end of said first transmission line; and
- a second transmission line coupled to provide an output of said oscillator, said second transmission line having a first end coupled to said output of said coupled line impedance transformer means.

11. The oscillator of claim 10 wherein said second harmonic dielectric resonator is independently tuned to a second harmonic frequency of said oscillator.

12. The oscillator of claim 10 wherein said fundamental dielectric resonator is electro-magnetically coupled in close proximity to said first transmission line.

13. The oscillator of claim 12 wherein said fundamental dielectric resonator is disposed at a fixed position from said IMPATT diode, to provide the necessary reactance for the IMPATT diode to oscillate.

14. The oscillator of claim 12 wherein said fundamental dielectric resonator is separated from said output load.

15. The oscillator of claim 10 wherein said IMPATT diode comprises a gallium arsenide IMPATT diode.

16. The oscillator of claim 10 wherein said coupled line impedance transformer means forms a DC block without requiring a separate blocking capacitor.

17. The oscillator of claim 10 wherein said coupled line impedance transformer means attenuates any residual second harmonic content of said oscillator.

* * * * *